(12) United States Patent
Kim et al.

(10) Patent No.: US 11,852,854 B2
(45) Date of Patent: Dec. 26, 2023

(54) DISPLAY DEVICE

(71) Applicant: Samsung Display Co., Ltd., Yongin-Si (KR)

(72) Inventors: Youngchan Kim, Incheon (KR); Jaeho You, Gwangmyeong-si (KR); Jeongwoo Park, Yongin-si (KR); Hyun Jin Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/495,755

(22) Filed: Oct. 6, 2021

(65) Prior Publication Data

US 2022/0221639 A1 Jul. 14, 2022

(30) Foreign Application Priority Data

Jan. 8, 2021 (KR) .................. 10-2021-0002479

(51) Int. Cl.
  *H10K 59/38* (2023.01)
  *G02B 5/23* (2006.01)
  *F21V 8/00* (2006.01)

(52) U.S. Cl.
  CPC .............. *G02B 5/23* (2013.01); *G02B 6/005* (2013.01); *H10K 59/38* (2023.02)

(58) Field of Classification Search
  CPC .......... G02B 5/23; G02B 6/005; H01L 27/322
  See application file for complete search history.

(56) References Cited

U.S. PATENT DOCUMENTS

| 8,503,122 | B2 | 8/2013 | Liu et al. | |
| 2010/0201242 | A1 | 8/2010 | Liu et al. | |
| 2011/0215305 | A1* | 9/2011 | Kim | H01L 27/3206 257/40 |
| 2016/0146988 | A1* | 5/2016 | Kim | H01L 51/5284 257/40 |
| 2017/0168211 | A1* | 6/2017 | Donahue | G02B 6/0018 |
| 2018/0259799 | A1* | 9/2018 | Kroon | G02F 1/1323 |
| 2019/0156094 | A1* | 5/2019 | Du | G06V 40/1318 |
| 2019/0318688 | A1* | 10/2019 | Kondo | G02F 1/0126 |
| 2020/0066811 | A1* | 2/2020 | Cha | H01L 51/524 |
| 2021/0118962 | A1* | 4/2021 | Shin | H01L 27/3232 |
| 2021/0225954 | A1* | 7/2021 | Zhang | H01L 27/322 |

FOREIGN PATENT DOCUMENTS

| KR | 10-1206285 B1 | 11/2012 |
| KR | 10-2017-0026017 A | 3/2017 |
| KR | 10-2019-0078831 A | 7/2019 |
| KR | 10-2120056 B1 | 6/2020 |

* cited by examiner

*Primary Examiner* — Fatima N Farokhrooz
(74) *Attorney, Agent, or Firm* — Innovation Counsel LLP

(57) ABSTRACT

An embodiment of a display device includes a substrate, a first light-emitting element, and a light control layer. The substrate includes a display area and a peripheral area adjacent to the display area, and the display area includes a light-emitting area and a light-blocking area. The first light-emitting element is disposed in the light-emitting area on the substrate and emits a first light having a first wavelength range. The light control layer is disposed on the first light-emitting element, and defines an opening exposing a portion of the light-emitting area. The light control layer includes a photochromic material such that in operation a second light having a second wavelength range different from the first wavelength range applied to the light control layer discolors the light control layer.

15 Claims, 13 Drawing Sheets

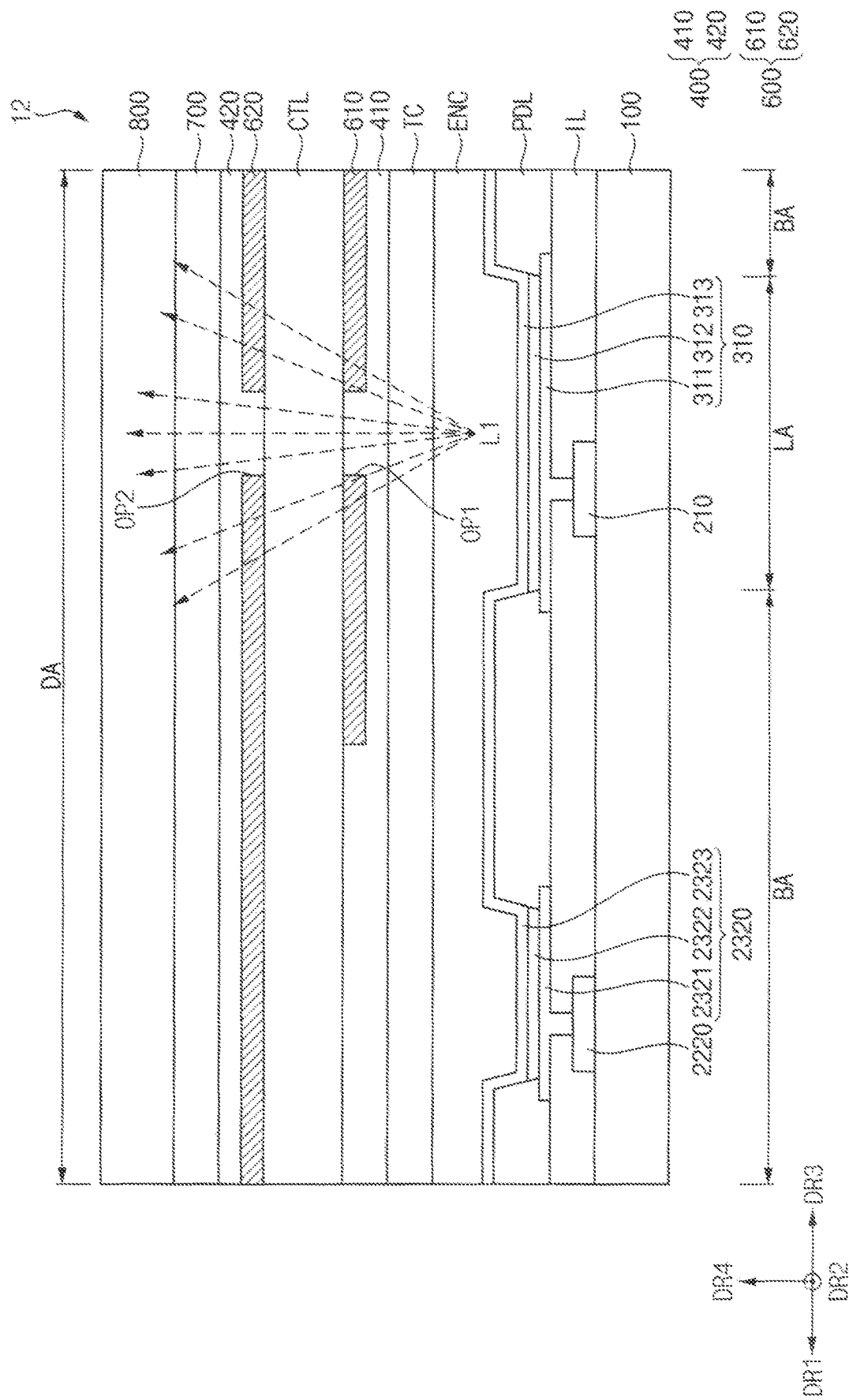

DISPLAY DEVICE

CROSS-REFERENCE TO RELATED APPLICATION

This application claims priority from and the benefit of Korean Patent Application No. 10-2021-0002479, filed on Jan. 8, 2021, which is hereby incorporated by reference for all purposes as if fully set forth herein.

BACKGROUND

1. Field

Embodiments of the present inventive concept relate to a display device. More particularly, embodiments of the present inventive concept relate to a display device capable of adjusting a viewing angle.

2. Description of the Related Art

Flat panel display devices are replacing cathode ray tube display devices as display devices due to their lightweight and thin characteristics. As representative examples of such flat panel display devices, there are liquid crystal display devices and organic light-emitting element display devices.

In general, the display device may display an image in a wide viewing angle mode, but sometimes it may be necessary to display the image in a narrow viewing angle mode so that others cannot see the image displayed on the display device.

SUMMARY

A display device according to an embodiment may include a substrate, a first light-emitting element, and a light control layer. The substrate may include a display area and a peripheral area adjacent to the display area, and the display area may include a light-emitting area and a light-blocking area. The first light-emitting element may be disposed in the light-emitting area on the substrate, and may emit a first light having a first wavelength range. The light control layer may be disposed on the first light-emitting element, and may define an opening exposing a portion of the light-emitting area. The light control layer may include a photochromic material such that in operation a second light having a second wavelength range different from the first wavelength range applied to the light control layer discolors the light control layer.

In an embodiment, the display device may further include a light guide layer disposed in the display area and the peripheral area on the first light-emitting element. The second light may be incident into the light guide layer in the peripheral area. The light guide layer may transmit the second light to the display area.

In an embodiment, the light guide layer may contact the light control layer. A refractive index of the light guide layer may be greater than a refractive index of the light control layer.

In an embodiment, a first optical pattern may be formed on the light guide layer. The first optical pattern may overlap the display area. At least a portion of the second light may be output from the light guide layer to the light control layer by the first optical pattern.

In an embodiment, the first optical pattern may include a diffraction grating selectively diffracting a light having the second wavelength range.

In an embodiment, the first optical pattern may include a plurality of scattering patterns.

In an embodiment, the light control layer may include a first light control layer disposed under the light guide layer and a second light control layer disposed on the light guide layer.

In an embodiment, the display device may further include a second light-emitting element disposed in the peripheral area on the substrate. The second light-emitting element may emit the second light having the second wavelength range.

In an embodiment, the first light-emitting element may be driven by a first transistor, and the second light-emitting element may be driven by a second transistor different from the first transistor.

In an embodiment, a second optical pattern may be formed on the light guide layer. The second optical pattern may overlap the peripheral area. At least a portion of the second light emitted from the second light-emitting element may be refracted toward the display area by the second optical pattern.

In an embodiment, the display device may further include a second light-emitting element disposed adjacent to a side portion of the light guide layer. The second light-emitting element may emit the second light having the second wavelength range.

In an embodiment, the display device may further include a second light-emitting element disposed in the display area on the substrate. The second light-emitting element may emit the second light having the second wavelength range.

In an embodiment, the light-blocking area may surround the light-emitting area in a plan view. The second light-emitting element may be disposed in the light-blocking area on the substrate.

In an embodiment, the first light-emitting element may be driven by a first transistor, and the second light-emitting element may be driven by a second transistor different from the first transistor.

In an embodiment, the light control layer may include a first light control layer and a second light control layer disposed on the first light control layer and spaced apart from the first light control layer.

In an embodiment, the display device may further include a light absorption layer disposed on the light control layer. The light absorption layer may selectively absorb a light having the second wavelength range.

In an embodiment, the light control layer may have a slit shape in a plan view.

In an embodiment, the light control layer may have a lattice shape in a plan view.

In an embodiment, the light-emitting area may be provided in plural. The light control layer may define a plurality of openings overlapping the plurality of light-emitting area, respectively.

In an embodiment, the first light may be visible light, and the second light may be ultraviolet (UV) light or infrared (IR) light.

The display device according to embodiments may include the first light-emitting element and the second light-emitting element. The first light-emitting element may emit the first light for displaying the image. The second light-emitting element may emit the second light for switching between the wide viewing angle mode and the narrow viewing angle mode. Accordingly, the viewing angle of the display device may be adjusted without attaching a separate optical film. In addition, when the display device is in the narrow viewing angle mode, a portion of the first light having a viewing angle greater than or equal to a predetermined angle among the first light emitted from each of the pixels may be blocked, and another portion of the first light having a viewing angle less than to the predetermined angle may be emitted to outside of the display device. Accordingly, a resolution of the display device may not be reduced even in the narrow viewing angle mode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 8A and 8B are cross-sectional views illustrating a display device according to still another embodiment.

DETAILED DESCRIPTION

Embodiments of the present inventive concept provide a display device capable of adjusting a viewing angle. Additional features of the inventive concepts will be set forth in the description which follows, and in part will be apparent from the description, or may be learned by practice of the inventive concepts.

Illustrative, non-limiting embodiments will be more clearly understood from the following detailed description in conjunction with the accompanying drawings.

Figure 1:
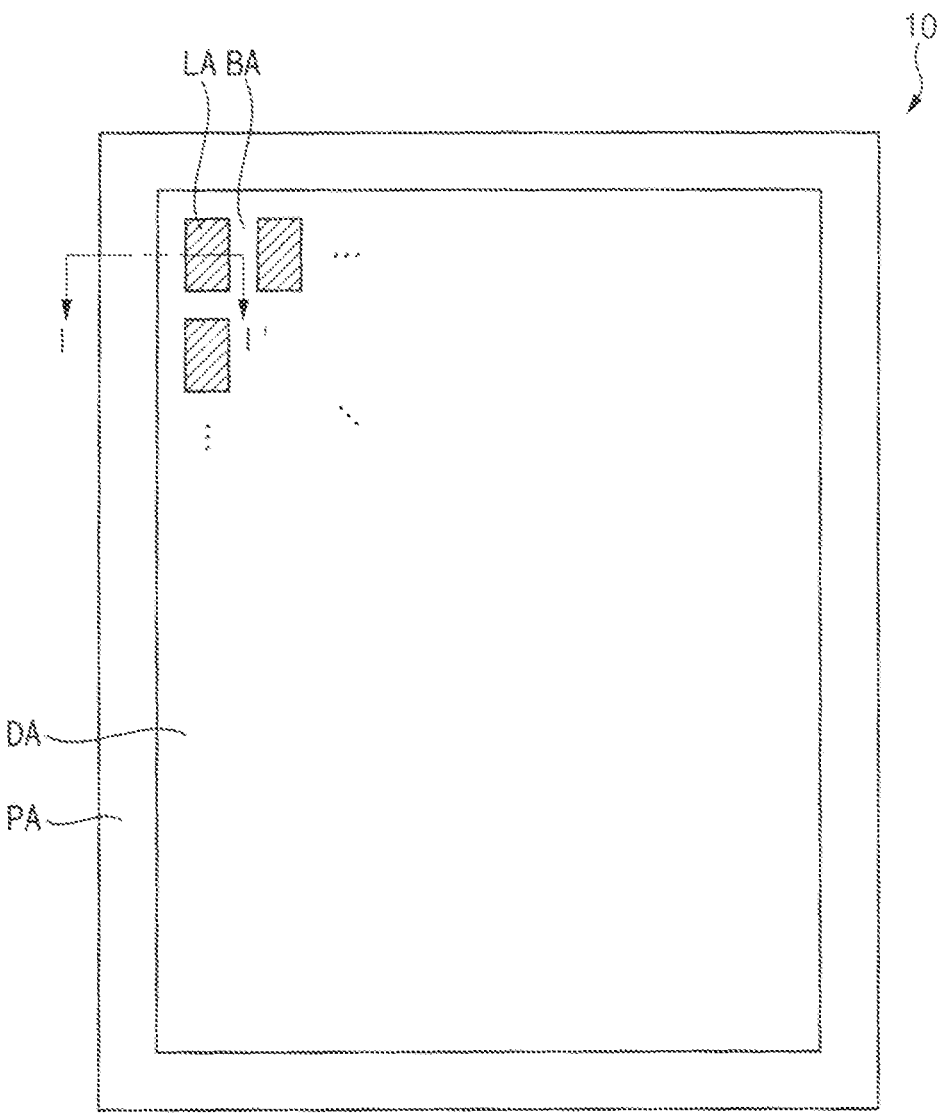
FIG. 1 is a plan view illustrating a display device according to an embodiment.

FIG. 1 is a plan view illustrating a display device according to an embodiment.

Referring to FIG. 1, a display device 10 according to an embodiment may include a display area DA and a peripheral area PA. A plurality of pixels may be disposed in the display area DA. An image may be displayed in the display area DA. The peripheral area PA may be adjacent to the display area DA. For example, the peripheral area PA may be around (e.g., surround) the display area DA in a plan view.

The display area DA may include a plurality of light-emitting areas LA and a light-blocking area BA. In an embodiment, the light-emitting areas LA may correspond to the pixels, respectively. For example, the light-emitting areas LA may be arranged in a matrix form in a first direction DR1 and a second direction DR2 crossing the first direction DR1. For example, the second direction DR2 may be perpendicular to the first direction DR1. In an embodiment, the light-blocking area BA may be around (e.g., surround) the light-emitting areas LA in a plan view.

First light-emitting elements (e.g., a first light-emitting element 310 of FIG. 2A) may be disposed in the light-emitting areas LA. Each of the first light-emitting elements may emit a first light having a first wavelength range. The first light may be visible light. For example, red light, green light, or blue light may be emitted from each of the light-emitting areas LA. In specific, a first light-emitting area in which red light is emitted, a second light-emitting area in which green light is emitted, and a third light-emitting area in which blue light is emitted may be repeatedly disposed in the display area DA. The image may be displayed by the first lights (e.g., visible light) emitted from the first light-emitting elements disposed in the display area DA.

In an embodiment, a black matrix may be disposed in the light-blocking area BA. The black matrix may prevent or reduce color mixing of the first lights (e.g., red light, green light, and blue light) emitted from the light-emitting areas LA adjacent to each other.

In an embodiment, a second light-emitting element (e.g., a second light-emitting element 320 of FIG. 2A) may be disposed in the peripheral area PA. The second light-emitting element may emit a second light having a second wavelength range different from the first wavelength range. For example, the second light may be ultraviolet (UV) light or infrared (IR) light. A viewing angle of the display device 10 may be adjusted by the second light. This will be described in detail later.

In an embodiment, the second light-emitting element disposed in the peripheral area PA may be provided in plural. The second light-emitting elements may be disposed adjacent to at least one side portion of the display area DA.

Figure 2A:
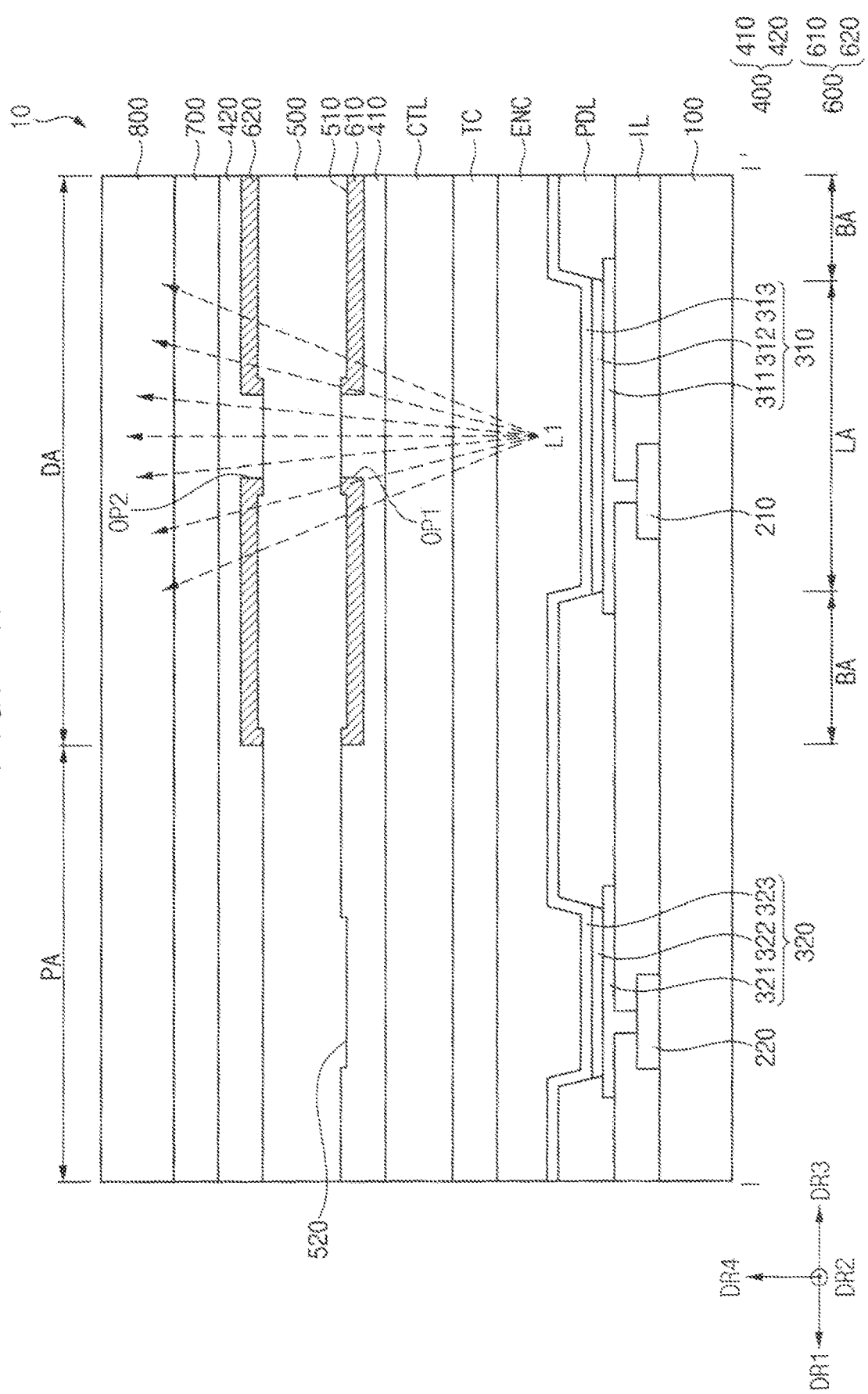
FIGS. 2A and 2B are cross-sectional views illustrating an example taken along the line I-I' of FIG. 1.
Figure 2B:
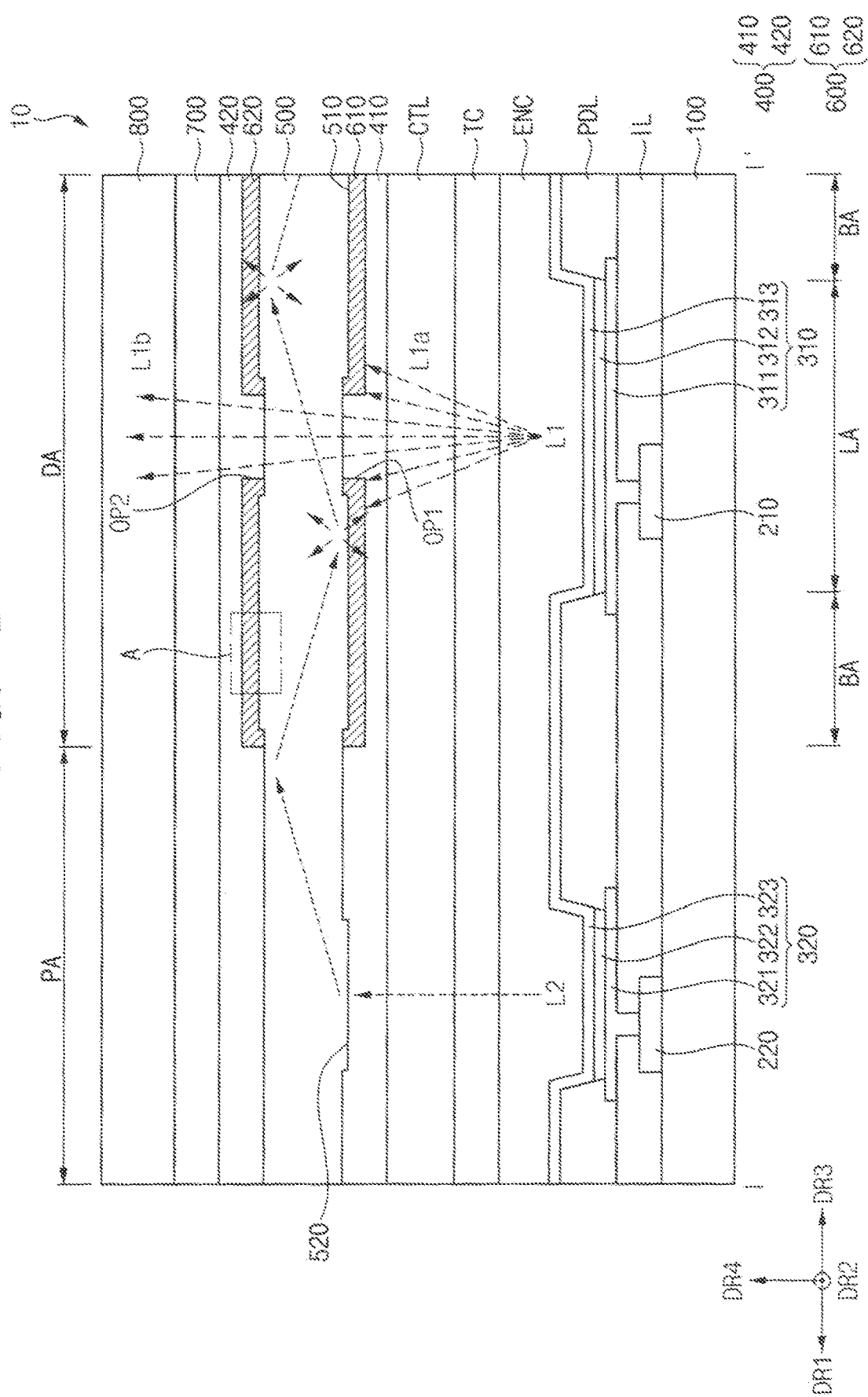

FIGS. 2A and 2B are cross-sectional views illustrating an example taken along the line I-I' of FIG. 1. For example, FIG. 2A may illustrate the display device 10 in a first mode, and FIG. 2B may illustrate the display device 10 in a second mode. The first mode may be a wide viewing angle mode, and the second mode may be a narrow viewing angle mode.

Referring to FIGS. 1, 2A, and 2B, the display device 10 according to an embodiment may include a first substrate 100, a first transistor 210, a first light-emitting element 310, a second transistor 220, a second light-emitting element 320, an encapsulation layer ENC, a light guide layer 500, a light control layer 600, a light absorption layer 700, and a second substrate 800.

The first substrate 100 may be a transparent insulating substrate. For example, the first substrate 100 may be formed of glass, quartz, plastic, or the like.

The first substrate 100 may include the display area DA and the peripheral area PA. The peripheral area PA may be adjacent to the display area DA. For example, in FIGS. 2A and 2B, the peripheral area PA may be positioned in the first direction DR1 of the display area DA. The display area DA may include the light-emitting areas LA and the light-blocking area BA. Although only one light-emitting area LA is illustrated in FIGS. 2A and 2B, the light-emitting areas LA may be arranged in the second direction DR2 and a third direction DR3 opposite to the first direction DR1.

The first light-emitting element 310 may be disposed in the display area DA on the first substrate 100. The first light-emitting element 310 may overlap the light-emitting area LA. The first light-emitting element 310 may emit a first light L1 having the first wavelength range. The first light L1 may be visible light. For example, the first light-emitting element 310 may emit red light, green light, or blue light.

The second light-emitting element 320 may be disposed in the peripheral area PA on the first substrate 100. For example, the second light-emitting element 320 may be formed using some of dummy pixels formed in the peripheral area PA. The second light-emitting element 320 may emit a second light L2 having the second wavelength range. The second light L2 may include various types of light having wavelength ranges different from the first wavelength range (e.g., a visible light wavelength range). Hereinafter, an example in which the second light L2 is UV light will be described.

Each of the first light-emitting element 310 and the second light-emitting element 320 may include (e.g., may be) an organic light-emitting diode, an inorganic light-emitting diode, and a quantum dot light-emitting diode, or the like. Hereinafter, an example in which each of the first light-emitting element 310 and the second light-emitting element 320 is the organic light-emitting diode will be described. For example, the first light-emitting element 310 may include a first pixel electrode 311, a first emission layer 312, and a first common electrode 313. The second light-emitting element 320 may include a second pixel electrode 321, a second emission layer 322, and a second common electrode 323.

The first light-emitting element 310 may be driven by the first transistor 210. For example, the first transistor 210 may be disposed in the display area DA on the first substrate 100. For example, each of the pixels may include the first transistor 210 and the first light-emitting element 310.

The second light-emitting element 320 may be driven by the second transistor 220 different from the first transistor 210. That is, the second light-emitting element 320 that emits the second light L2 (e.g., UV light) may be driven independently from the first light-emitting element 310 that emits the first light L1 (e.g., visible light). For example, the second transistor 220 may be disposed in the peripheral area PA on the first substrate 100.

In an embodiment, as illustrated in FIGS. 2A and 2B, the second light-emitting element 320 may emit the second light L2 only in the second mode. That is, the second transistor 220 may not drive the second light-emitting element 320 when the display device 10 is in the first mode (e.g., the wide viewing angle mode), and the second transistor 220 may drive the second light-emitting element 320 when the display device 10 is in the second mode (e.g., the narrow viewing angle mode).

In an embodiment, each of the active layers of the first and second transistors 210 and 220 may include an oxide semiconductor, a silicon semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like.

The first transistor 210 and the second transistor 220 may be covered by an insulating structure IL. For example, the insulating structure IL may include an inorganic insulating layer, an organic insulating layer, or a combination thereof.

The first pixel electrode 311 may be disposed on the first transistor 210, and may be electrically connected to the first transistor 210. The second pixel electrode 321 may be disposed on the second transistor 220, and may be electrically connected to the second transistor 220. Each of the first pixel electrode 311 and the second pixel electrode 321 may include a metal, an alloy, a conductive metal oxide, a conductive metal nitride, a transparent conductive material, or the like.

A pixel defining layer PDL may be disposed on the insulating structure IL. The pixel defining layer PDL may partially cover each of the first pixel electrode 311 and the second pixel electrode 321 on the insulating structure IL. The pixel defining layer PDL may have pixel openings exposing at least a portion of each of the first pixel electrode 311 and the second pixel electrode 321, respectively. For example, a first pixel opening may expose a central portion of the first pixel electrode 311, and a second pixel opening may expose a central portion of the second pixel electrode 321. The pixel defining layer PDL may cover a peripheral portion each of the first pixel electrode 311 and the second pixel electrode 321. The pixel defining layer PDL may include an organic insulating material.

The first emission layer 312 may be disposed on the first pixel electrode 311 exposed by the first pixel opening. That is, the first emission layer 312 may be disposed in the first pixel opening. The first emission layer 312 may be disposed between the first pixel electrode 311 and the first common electrode 313. The first emission layer 312 may include an organic light emitting material that emits the first light L1 (e.g., visible light) having the first wavelength range.

The second emission layer 322 may be disposed on the second pixel electrode 321 exposed by the second pixel opening. That is, the second emission layer 322 may be disposed in the second pixel opening. The second emission layer 322 may be disposed between the second pixel electrode 321 and the second common electrode 323. The second emission layer 322 may include an organic light emitting material that emits the second light L2 (e.g., UV light) having the second wavelength range.

The first common electrode 313 may be disposed on the first emission layer 312, and may overlap the first pixel electrode 311. The second common electrode 323 may be disposed on the second emission layer 322, and may overlap the second pixel electrode 321. In an embodiment, the first common electrode 313 and the second common electrode 323 may be integrally formed. In another embodiment, the first common electrode 313 and the second common electrode 323 may be separately formed.

The encapsulation layer ENC may be disposed on the first light-emitting element 310 and the second light-emitting element 320. The encapsulation layer ENC may cover (e.g., may encapsulate) the first light-emitting element 310 and the second light-emitting element 320 to protect the first light-emitting element 310 and the second light-emitting element 320 from foreign substances.

The encapsulation layer ENC may include at least one inorganic encapsulation layer and at least one organic encapsulation layer. For example, the encapsulation layer ENC may include a first inorganic encapsulation layer, an organic encapsulation layer disposed on the first inorganic encapsulation layer, and a second inorganic encapsulation layer disposed on the organic encapsulation layer.

In an embodiment, a touch sensing layer TC may be disposed on the encapsulation layer ENC. The touch sensing layer TC may sense a contact or non-contact touch of a user. For example, the touch sensing layer TC may sense the touch of the user by a capacitance method. In specific, the touch sensing layer TC may sense the touch of the user by a self-capacitance method or a mutual capacitance method. In another embodiment, the touch sensing layer TC may be omitted.

In an embodiment, a light collecting layer CTL may be disposed on the touch sensing layer TC. For example, the light condensing layer CTL may include a plurality of micro lenses. Accordingly, a path of the first light L1 emitted from the first light-emitting element 310 may be collected toward a fourth direction DR4 (e.g., a thickness direction). In another embodiment, the light collecting layer CTL may be omitted.

The light guide layer 500 may be disposed on the encapsulation layer ENC. In an embodiment, the light guide layer 500 may be entirely disposed in the display area DA and the peripheral area PA on the encapsulation layer ENC. That is, the light guide layer 500 may be disposed on the first and second light-emitting elements 310 and 320, and may overlap each of the first and second light-emitting elements 310 and 320.

For example, as illustrated in FIG. 2B, when the display device 10 is in the second mode (e.g., the narrow viewing angle mode), the second light L2 (e.g. UV light) emitted from the second light-emitting element 320 may be incident into a portion of the light guide layer 500 overlapping the peripheral area PA. The light guide layer 500 may transmit (e.g., may deliver) the second light L2 to the display area DA.

In an embodiment, the second light L2 incident into the light guide layer 500 in the peripheral area PA may be transmitted (e.g., may proceed) to the display area DA (i.e., in the third direction DR3 of FIG. 2B) by total internal reflection. For example, a refractive index of the light guide layer 500 may be greater than each of refractive indices of layers that contacts an upper portion or a lower portion of the light guide layer 500 (e.g., the light control layer 600, a planarization layer 400, or the like). Accordingly, the second light L2 incident into the light guide layer 500 in the peripheral area PA may be transmitted to the display area DA by total internal reflection.

A first optical pattern 510 and a second optical pattern 520 may be formed on the light guide layer 500.

In an embodiment, the first optical pattern 510 may be formed on an upper surface or a lower surface of the light guide layer 500 overlapping the display area DA. The first optical pattern 510 may output (e.g., may emit) at least a portion of the second light L2 transmitted inside of the light guide layer 500 to outside of the light guide layer 500 (e.g., to an upper layer or a lower layer of the light guide layer 500). That is, the second light L2 transmitted (e.g., proceeding) in the third direction DR3 inside of the light guide layer 500 by total internal reflection may be partially emitted to the outside of the light guide layer 500 by the first optical pattern 510. Another portion of the second light L2 that is not emitted to the outside of the light guide layer 500 may be continuously transmitted in the third direction DR3 by total internal reflection.

For example, as illustrated in the drawing, the first optical pattern 510 may be provided in plural, and the plurality of first optical patterns 510 may be spaced apart at a predetermined interval in the third direction DR3 to overlap the light control layer 600. For another example, the first optical pattern 510 may be entirely formed in the display area DA.

The first optical pattern 510 may be formed in various ways. For example, the first optical pattern 510 may be implemented as a diffraction optical element, a hologram optical element, a micro pattern, or the like.

Figure 3A:
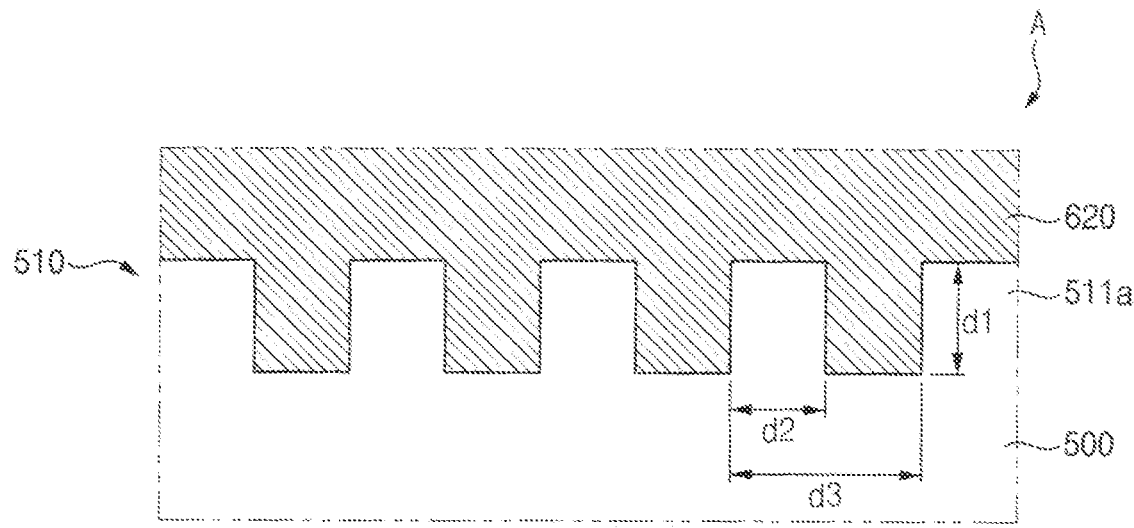
FIG. 3A is an enlarged cross-sectional view illustrating an example of area "A" of FIG. 2B.
Figure 3B:
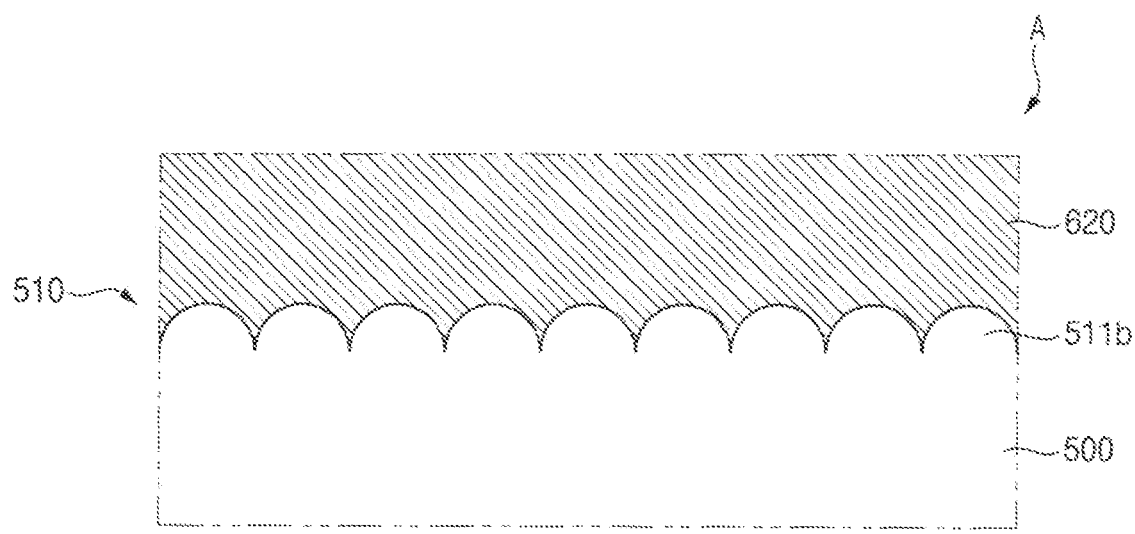
FIG. 3B is an enlarged cross-sectional view illustrating another example of area "A" of FIG. 2B.

FIG. 3A is an enlarged cross-sectional view illustrating an example of area "A" of FIG. 2B. FIG. 3B is an enlarged cross-sectional view illustrating another example of area "A" of FIG. 2B.

Referring to FIGS. 2A, 2B, and 3A, in an embodiment, the first optical pattern 510 may include a diffraction grating having wavelength selectivity. The diffraction grating may selectively diffract a light having the second wavelength range (e.g., UV light) among lights having various wavelength ranges (e.g., visible light, UV light, and the like). The diffraction grating may not optically affect a light having a wavelength range different from the second wavelength range (e.g., visible light). For example, by adjusting a height d1, a width d2, a pitch d3, a formation angle, or the like of grating patterns 511a included in the diffraction grating, the first optical pattern 510 may be formed to have wavelength selectivity with respect to the second wavelength range (e.g., UV light wavelength range).

For example, as illustrated in FIG. 2A, at least a portion of the first light L1 (e.g., visible light) emitted from the first light-emitting element 310 may proceed to the first optical pattern 510. The first light L1 may have the first wavelength range different from the second wavelength range. Accordingly, the first optical pattern 510 may transmit the first light L1 without optical change.

For example, as illustrated in FIG. 2B, at least a portion of the second light L2 (e.g., UV light) transmitted in the third direction DR3 inside of the light guide layer 500 may proceed to the first optical pattern 510. The second light L2 may have the second wavelength range. Accordingly, the portion of the second light L2 proceeding to the first optical pattern 510 may be diffracted by the first optical pattern 510. Accordingly, the portion of the second light L2 may not be totally reflected inside of the light guide layer 500, and may be output (e.g., may be emitted) to the outside of the light guide layer 500.

Referring to FIGS. 2A, 2B, and 3B, in another embodiment, the first optical pattern 510 may be a micro pattern including a plurality of scattering patterns 511b. For example, each of the scattering patterns 511b may have a cross-sectional shape such as a lens, a prism, or the like.

For example, as illustrated in FIG. 2B, at least a portion of the second light L2 transmitted in the third direction DR3 inside of the light guide layer 500 may proceed to the first optical pattern 510. The portion of the second light L2 proceeding to the first optical pattern 510 may be scattered by the scattering patterns 511b. Accordingly, the portion of the second light L2 may not be totally reflected inside of the light guide layer 500, and may be output (e.g., may be emitted) to the outside of the light guide layer 500.

Referring back to FIGS. 2A and 2B, in an embodiment, the second optical pattern 520 may be formed on a portion of the lower surface of the light guide layer 500 overlapping the peripheral area PA. The second optical pattern 520 may refract the second light L2 incident in the peripheral area PA so that the second light L2 may be totally reflected inside of the light guide layer 500. That is, as illustrated in FIG. 2B, the second light L2 emitted from the second light-emitting element 320 may be refracted toward the display area DA (i.e., toward the third direction DR3) by the second optical pattern 520.

The second optical pattern 520 may be formed in various ways. For example, the second optical pattern 520 may be implemented as the diffraction optical element, the hologram optical element, the micro pattern, or the like.

The light control layer 600 may be disposed in the display area DA on the encapsulation layer ENC. That is, the light control layer 600 may be disposed on the first light-emitting element 310. The light control layer 600 may have (e.g., may define) an opening exposing a portion of the light-emitting area LA.

The light control layer 600 may include a photochromic material that is discolored by a light having a specific wavelength range. In an embodiment, the photochromic material may be discolored by the second light L2 (e.g., UV light) having the second wavelength range. The photochromic material may not be discolored by the first light L1 (e.g., visible light) having the first wavelength range. In addition, when the photochromic material is not discolored by the second light L2, the photochromic material may transmit the first light L1. When the photochromic material is discolored by the second light L2, the photochromic material may absorb the first light L1 so that the photochromic material may block transmission of the first light L1. For example, when the photochromic material is discolored by the second light L2, the photochromic material may have a transmittance of about 10% or less with respect to the first light L1 (e.g., visible light). For example, the photochromic material may include azobenzene, spiropyran, diarylethene, or the like, but embodiments are not limited thereto.

Hereinafter, operations of the display device 10 in the first mode and the second mode will be described with reference to FIGS. 2A and 2B.

In FIG. 2A, when the display device 10 is in the first mode, the first transistor 210 may drive the first light-emitting element 310, and the second transistor 220 may not drive the second light-emitting element 320. Accordingly, the first light L1 (e.g., visible light) may be emitted from the first light-emitting element 310, and the second light L2 (e.g., UV light) may not be emitted from the second light-emitting element 320. Accordingly, the light control layer 600 may not be discolored. Accordingly, the light control layer 600 may transmit the first light L1. That is, the first light L1 emitted from the light-emitting area LA may not blocked by the light control layer 600, and may be emitted to outside of the display device 10 through the second substrate 800. Accordingly, the display device 10 may have a wide viewing angle.

In FIG. 2B, when the display device 10 is switched to the second mode, the second transistor 220 may drive the second light-emitting element 320. Accordingly, the second light L2 may be emitted from the second light-emitting element 320. As described above, the second light L2 emitted from the second light-emitting element 320 may be transmitted to the display area DA through the light guide layer 500. In addition, a portion of the second light L2 transmitted inside of the light guide layer 500 may be output (e.g., may be emitted) to the outside of the light guide layer 500 (e.g., to the light control layer 600) by the first optical pattern 510. Accordingly, the light control layer 600 may be discolored. Accordingly, a portion of the first light L1a proceeding to the light control layer 600 among the first light L1 emitted from the light-emitting area LA may be blocked by the light control layer 600. Another portion of the first light L1b proceeding to openings OP1 and OP2 among the first light L1 emitted from the light-emitting area LA may not be blocked by the light control layer 600, and may be emitted to outside of the display device 10 through the second substrate 800. That is, when the display device 10 is in the second mode, the light control layer 600 may block the portion of the first light L1a having a viewing angle greater than or equal to a predetermined angle among the first light L1 emitted from the light-emitting area LA. Accordingly, the display device 10 may have a narrow viewing angle.

When the display device 10 is switched to the first mode again, the second transistor 220 may not drive the second light-emitting element 320. Accordingly, the second light L2 may not be emitted from the second light-emitting element 320, and the light control layer 600 may be restored to have its original color. Accordingly, the light control layer 600 may transmit the first light L1 again, and the display device 10 may have the wide viewing angle again.

In an embodiment, as illustrated in FIGS. 2A and 2B, the light control layer 600 may include a first light control layer 610 and a second light control layer 620 spaced apart from each other in a fourth direction DR4. For example, the light guide layer 500 may be disposed between the first light control layer 610 and the second light control layer 620. That is, the first light control layer 610 may be disposed under the light guide layer 500, and the second light control layer 620 may be disposed on the light guide layer 500. In some embodiments, the light control layer 600 may be a single layer.

When the first and second light control layers 610 and 620 are disposed to be spaced apart from each other in the fourth direction DR4, a degree of decrease of the viewing angle of the display device 10 in the second mode may be relatively easily adjusted. For example, the degree of decrease of the viewing angle (e.g., a light emitting distribution of the first light L1) may be determined according to a ratio of a width of each of the openings OP1 and OP2 respectively formed in the first and the second light control layers 610 and 620 to a separation distance of the openings OP1 and OP2. In specific, as the ratio of the width to the separation distance increases, the degree of decrease of the viewing angle of the display device 10 in the second mode may be increased. That is, as the ratio of the width to the separation distance increases, the light emitting distribution of the first light L1 in the second mode may be decreased.

The light control layer 600 may be adjacent to the light guide layer 500. For example, the first light control layer 610 may contact the lower surface of the light guide layer 500, and the second light control layer 620 may contact the upper surface of the light guide layer 500. In this case, each of refractive indices of the first and second light control layers 610 and 620 may be less than the refractive index of the light guide layer 500. However, embodiments are not limited thereto. In another embodiment, the light control layer 600 may be spaced apart from the light guide layer 500.

Figure 4A:
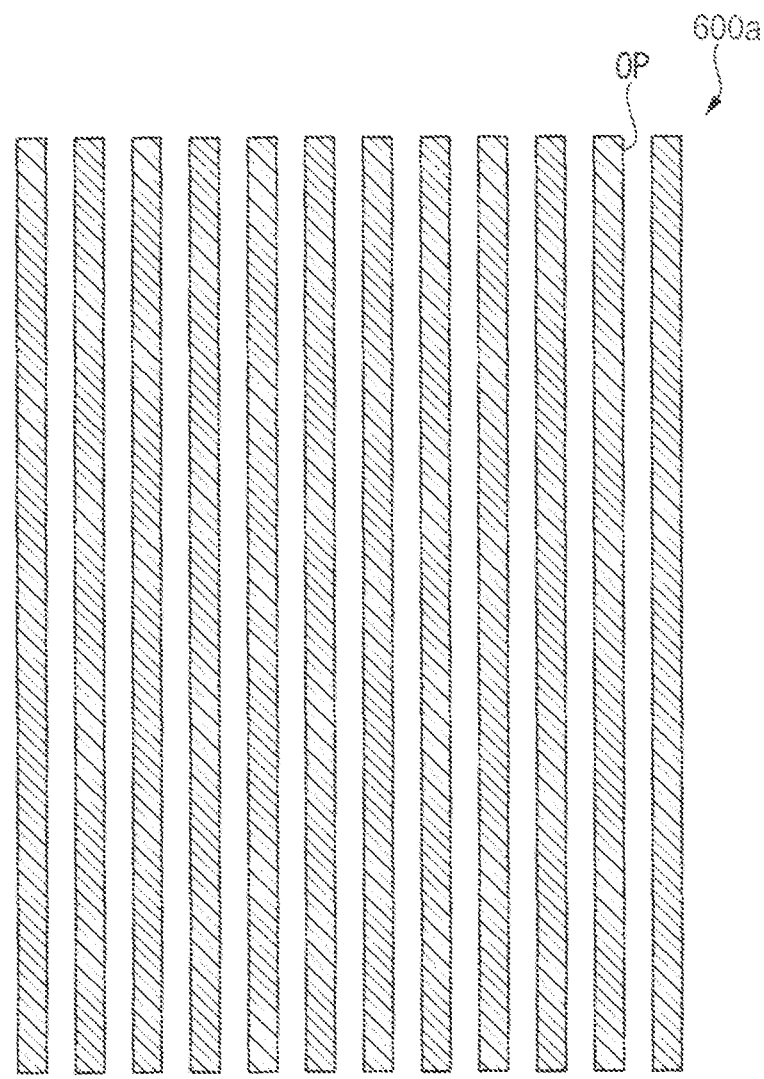
FIGS. 4A and 4B are plan views illustrating a light control layer according to an embodiment.
Figure 4B:
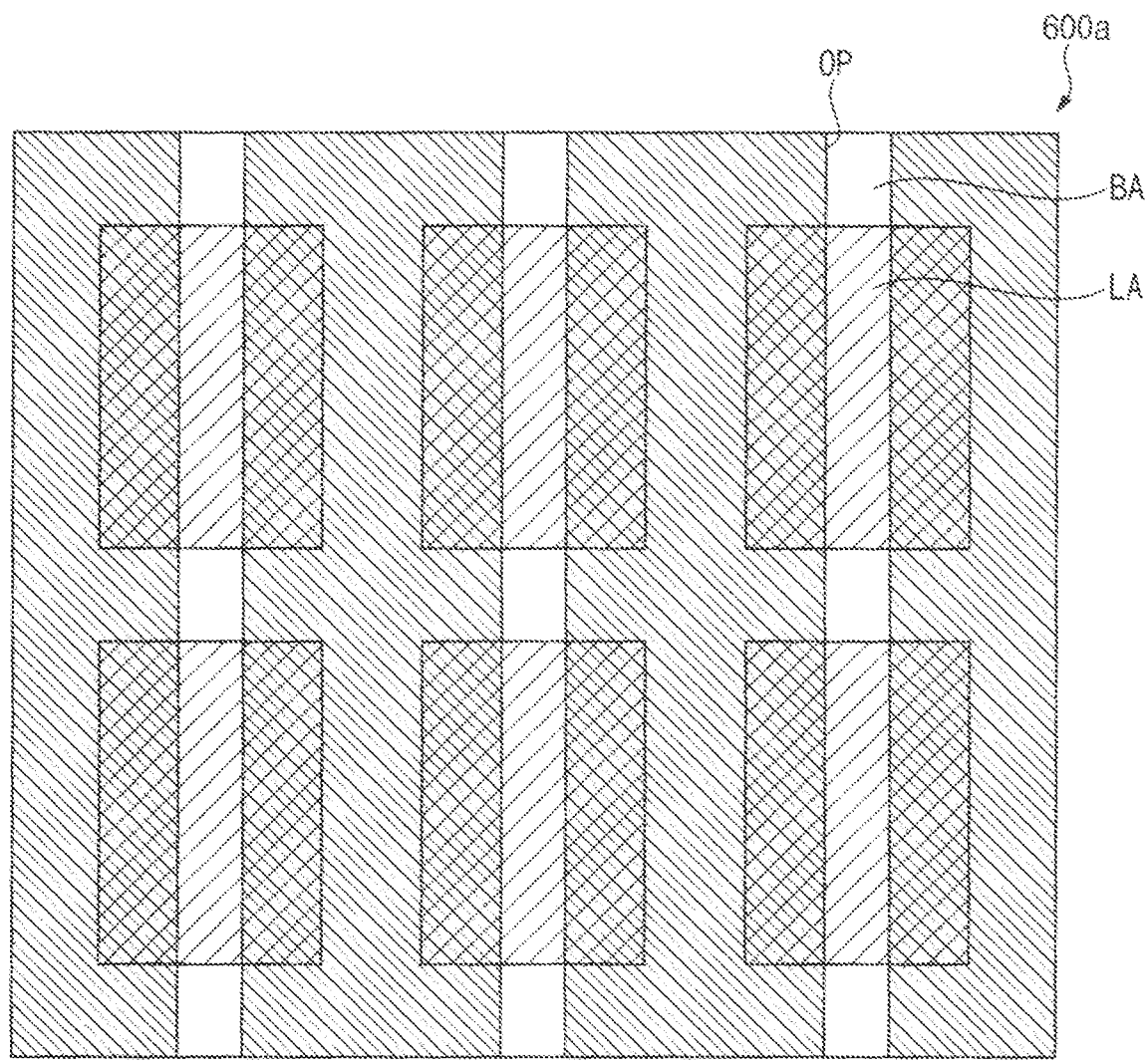
Figure 4B:
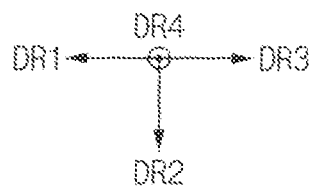

FIGS. 4A and 4B are plan views illustrating a light control layer according to an embodiment. For example, FIG. 4A may correspond to FIG. 1. FIG. 4B may be an enlarged view of a portion of the light control layer 600a of FIG. 4A.

Referring to FIGS. 1, 2A, 2B, 4A, and 4B, in an embodiment, the light control layer 600a may have a slit shape in a plan view. For example, the light control layer 600a may include a plurality of stripe patterns arranged in the first direction DR1, each of the stripe patterns extending in the second direction DR2. That is, the openings OP formed in the light control layer 600a may be arranged in the first direction DR1, each of the openings OP extending in the second direction DR2. Each of the openings OP may overlap the light-emitting areas LA arranged in the second direction DR2. According to an embodiment, in the second mode (e.g., the narrow viewing angle mode), a viewing angle of the display device 10 in the first direction DR1 may be decreased, but a viewing angle in the second direction DR2 may not be decreased. Alternatively, in order to decrease the viewing angle of the display device 10 in the second direction DR2, the light control layer 600a may be formed such that the stripe patterns are arranged in the second direction DR2.

Figure 5A:
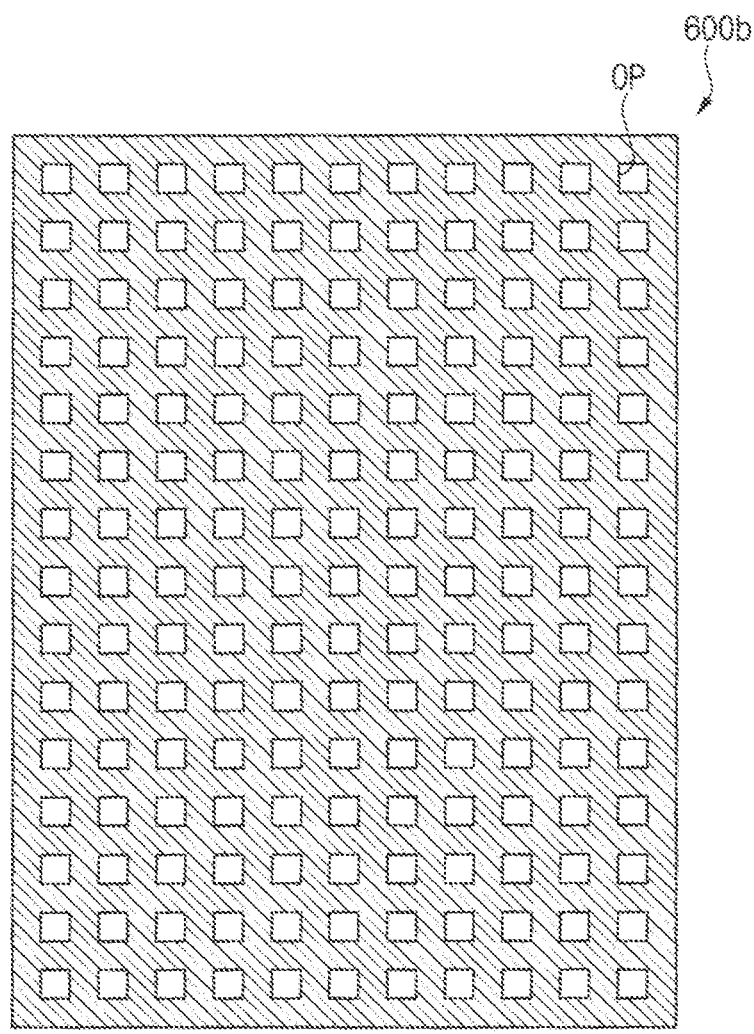
FIGS. 5A and 5B are plan views illustrating a light control layer according to another embodiment.
Figure 5A:
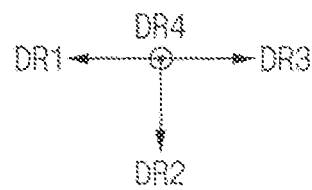
Figure 5B:
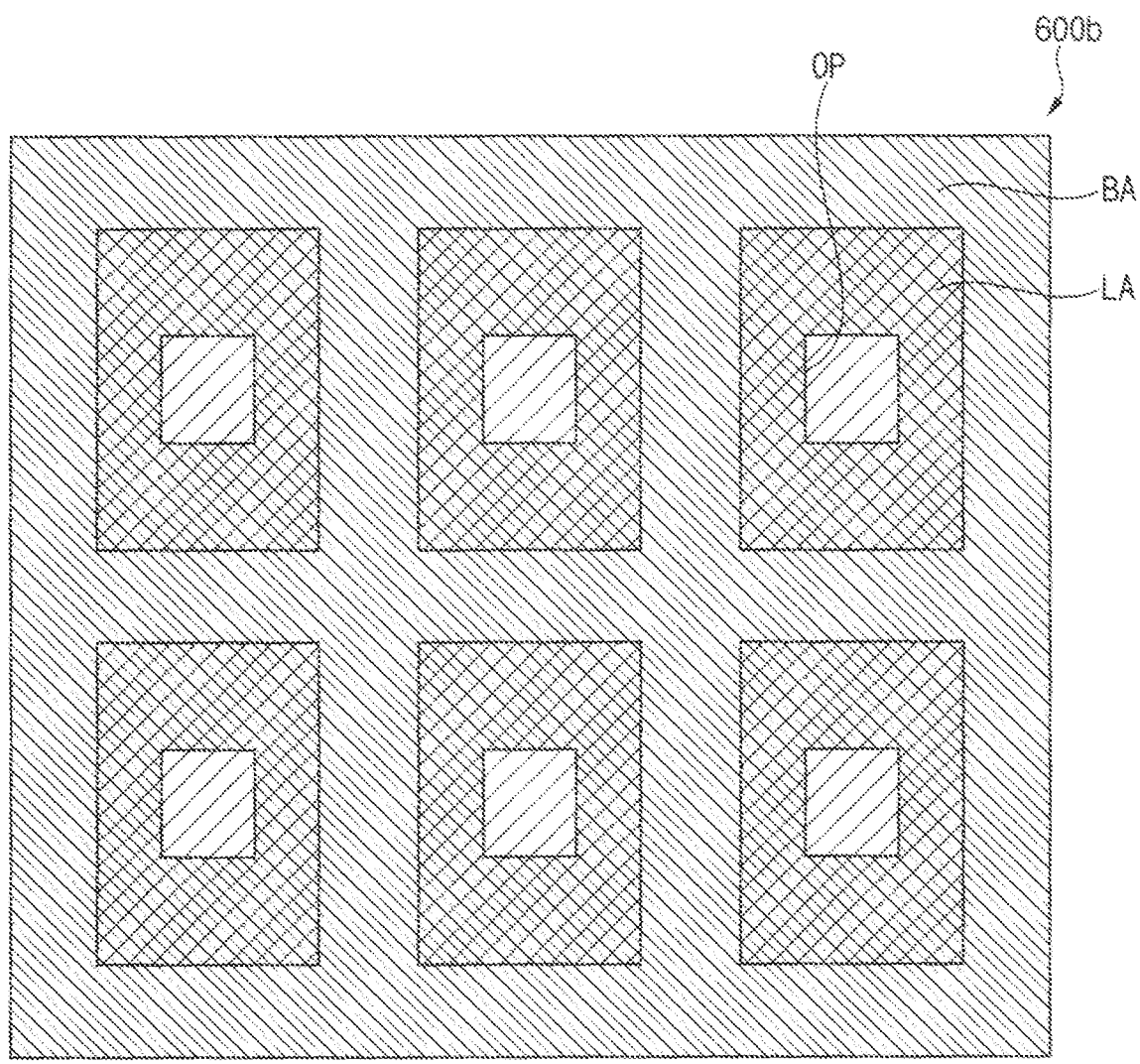

FIGS. 5A and 5B are plan views illustrating a light control layer according to another embodiment. For example, FIG. 5A may correspond to FIG. 1. FIG. 5B may be an enlarged view of a portion of the light control layer 600b of FIG. 5A.

Referring to FIGS. 1, 2A, 2B, 5A, and 5B, in another embodiment, the light control layer 600b may have a lattice shape in a plan view. That is, the openings OP formed in the light control layer 600b may be arranged in a matrix form in the first direction DR1 and the second direction DR2. The openings OP may overlap the light-emitting areas LA, respectively. For example, an area of each of the openings OP in a plan view may be less than an area of each of the light-emitting areas LA. According to another embodiment, in the second mode (e.g., the narrow viewing angle mode), both the viewing angle of the display device 10 in the first direction DR1 and the viewing angle in the second direction DR2 may be decreased.

Referring back to FIGS. 2A and 2B, in an embodiment, the display device 10 may further include a planarization layer 400. The planarization layer 400 may include a first and second planarization layers 410 and 420. The first planarization layer 410 may be disposed under the light guide layer 500. The first planarization layer 410 may provide a substantially flat lower surface. The second planarization layer 420 may be disposed on the light guide layer 500. The second planarization layer 420 may provide a substantially flat upper surface. Each of the first and second planarization layers 410 and 420 may include an organic material. Each of refractive indices of the first and second planarization layers 410 and 420 may be less than the refractive index of the light guide layer 500. In another embodiment, the planarization layer 400 may be omitted.

The light absorption layer 700 may be disposed on the light control layer 600. The light absorption layer 700 may be entirely disposed in the display area DA and the peripheral area PA on the light control layer 600. The light absorption layer 700 may selectively absorb the second light L2 (e.g., UV light) having the second wavelength range. That is, the light absorption layer 700 may block the second light L2 from being emitted to the outside of the display device 10. The light absorption layer 700 may transmit the first light L1 (e.g., visible light) having the first wavelength range.

The second substrate 800 may be a transparent substrate. For example, the second substrate 800 may be formed of glass, quartz, plastic, or the like. The second substrate 800 may transmit the first light L1 emitted from the light-emitting area LA.

Figure 6:
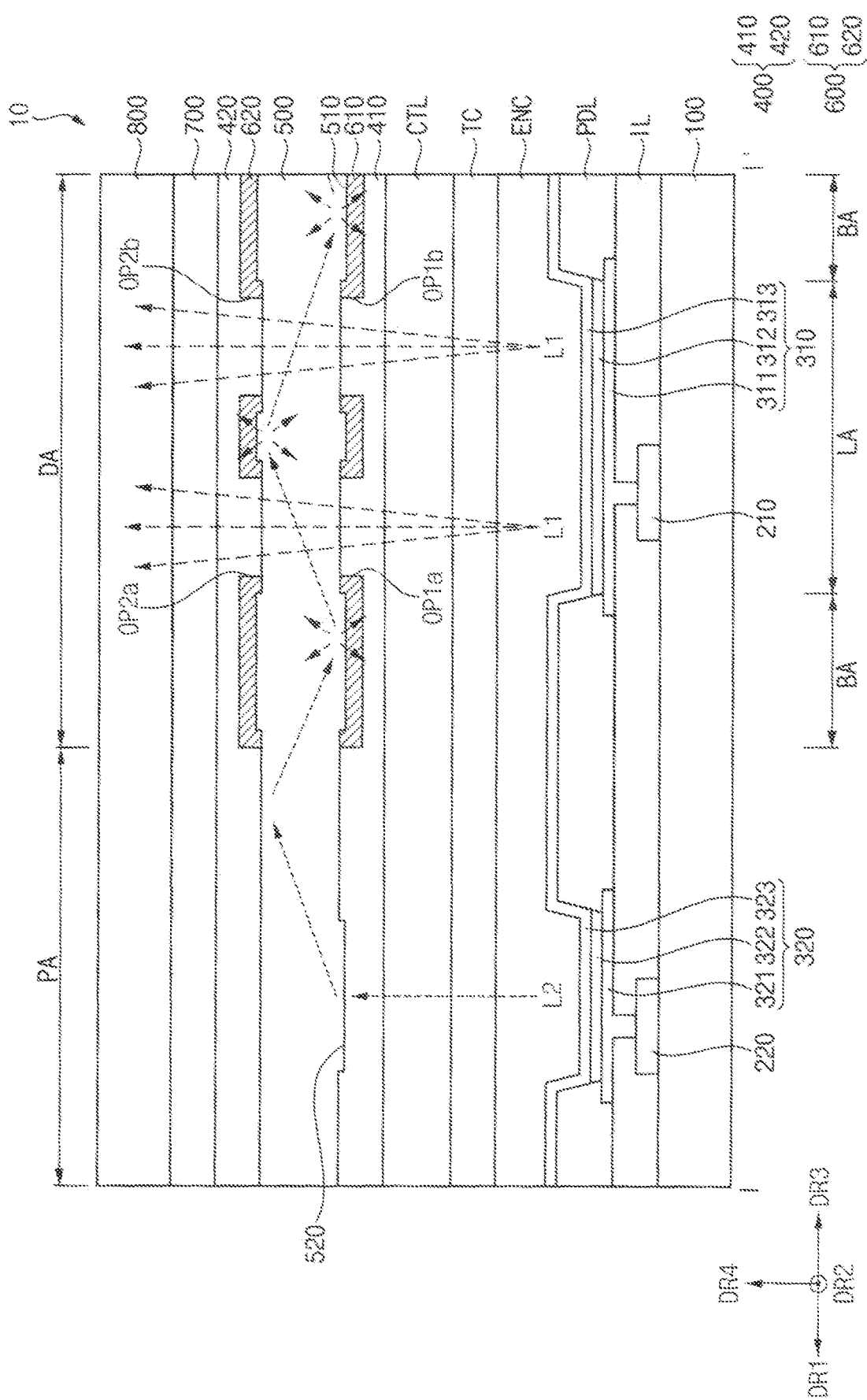
FIG. 6 is a cross-sectional view illustrating another example taken along the line I-I' of FIG. 1.

FIG. 6 is a cross-sectional view illustrating another example taken along the line I-I' of FIG. 1.

Referring to FIGS. 1 and 6, in an embodiment, the light control layer 600 may include a plurality of openings overlapping the light-emitting area LA. For example, the first light control layer 610 may include first openings OP1a and OP1b spaced apart from each other in the third direction DR3. The second light control layer 620 may include second openings OP2a and OP2b spaced apart from each other in the third direction DR3. The first openings OP1a and OP1b may overlap the second openings OP2a and OP2b, respectively.

In some embodiments, the display device 10 may display the image in the first mode implementing the wide viewing angle or the second mode implementing the narrow viewing angle. Accordingly, the viewing angle of the display device 10 may be adjusted. In addition, when the display device 10 is in the second mode, a portion of the first light L1a having a viewing angle greater than or equal to a predetermined angle among the first light L1 emitted from each of the pixels disposed in the display area DA may be blocked, and another portion of the first light L1b having a viewing angle less than to the predetermined angle may be emitted to outside of the display device 10. Accordingly, a resolution of the display device 10 may not be reduced even in the second mode. In addition, the second light-emitting element 320 may emit the second light L2 for switching between the first mode and the second mode. The second light-emitting element 320 may be disposed in the peripheral area PA of the display device 10. In some embodiments, the second light-emitting element 320 may be formed using some of the dummy pixels formed in the peripheral area PA. Accordingly, the display device 10 capable of adjusting the viewing angle may be manufactured without affecting the display area DA. In addition, the viewing angle of the display device 10 may be adjusted without attaching a separate optical film for adjusting the viewing angle of the display device 10.

Figure 7A:
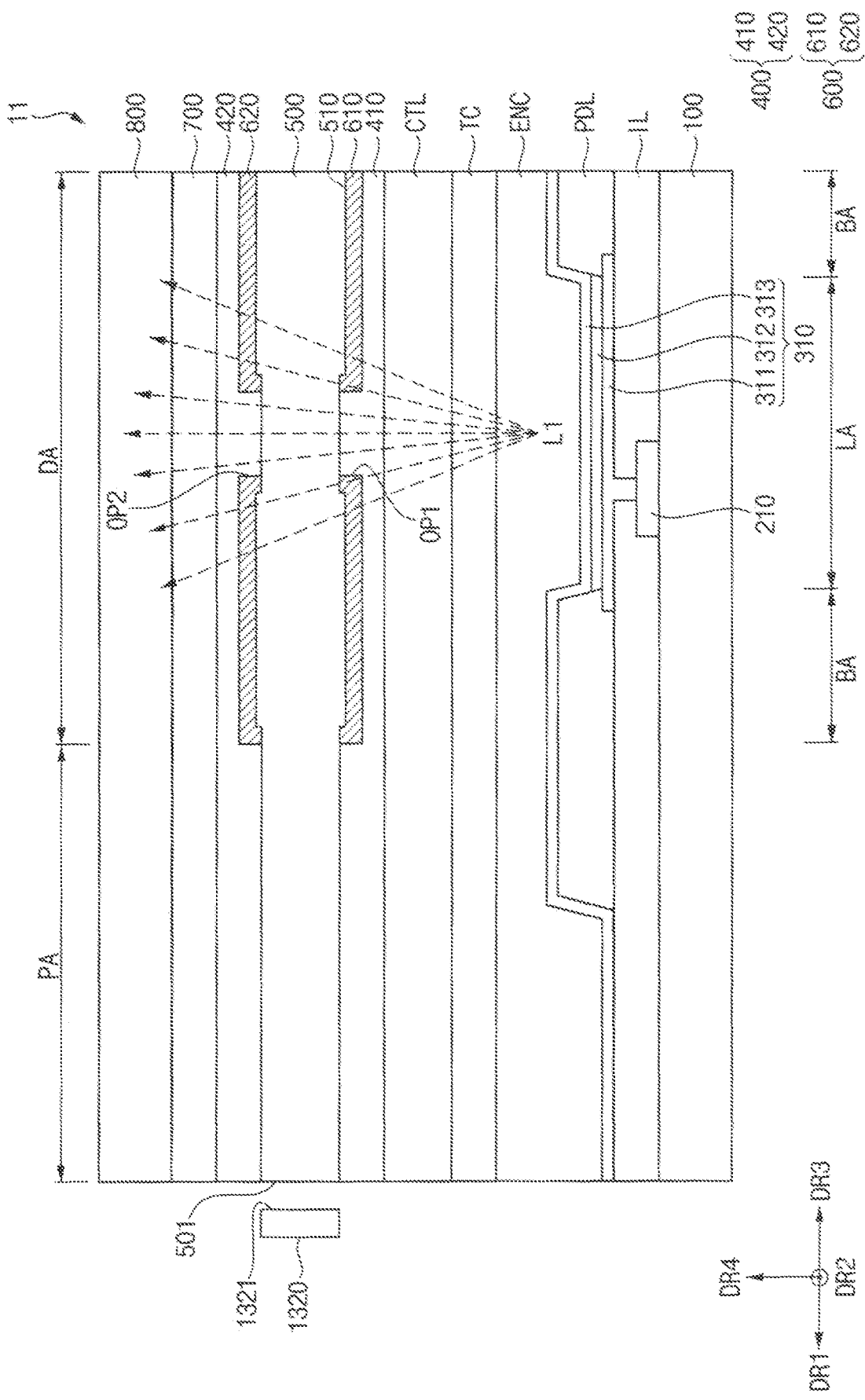
FIGS. 7A and 7B are cross-sectional views illustrating a display device according to another embodiment.
Figure 7B:
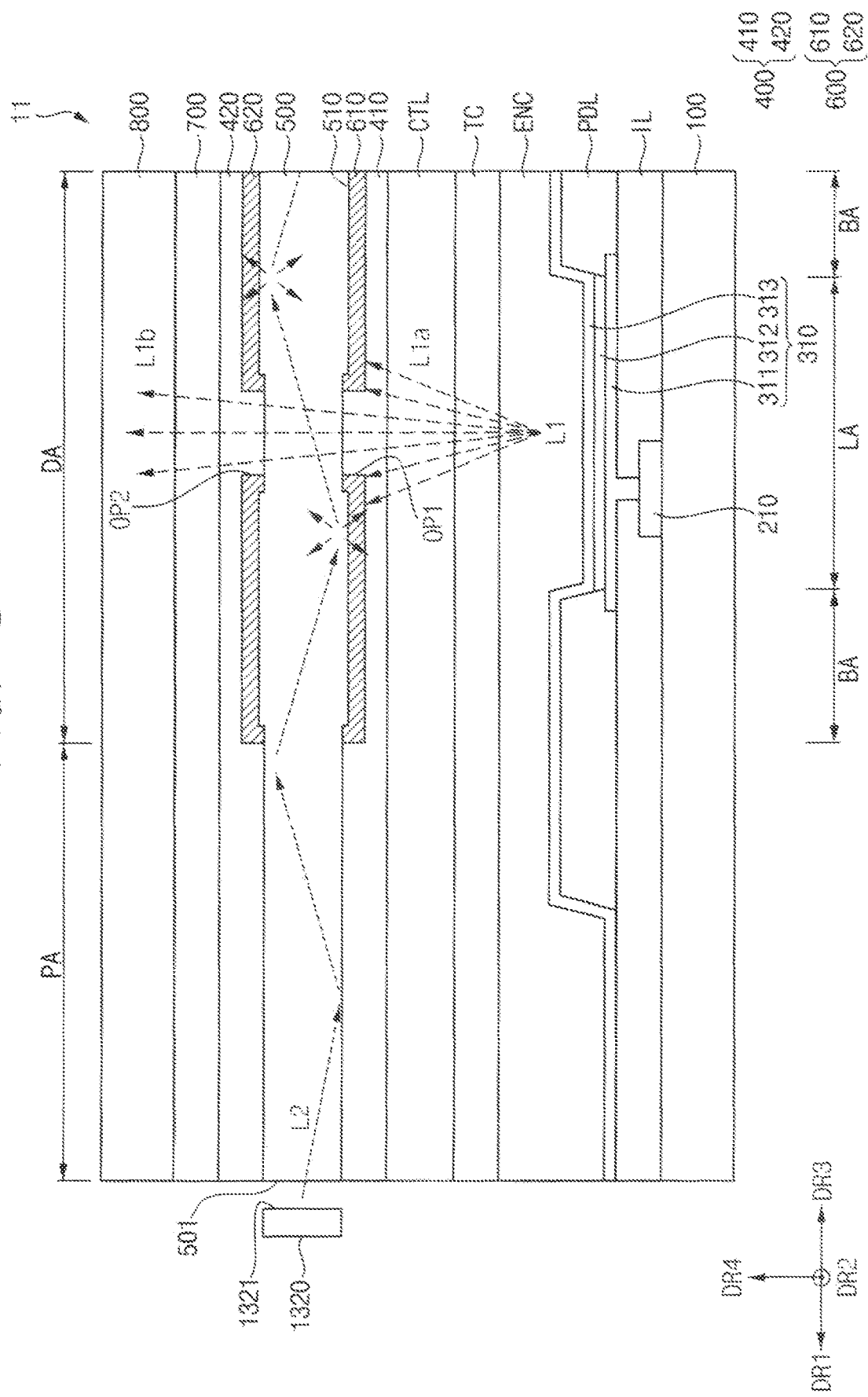

FIGS. 7A and 7B are cross-sectional views illustrating a display device according to another embodiment. For example, FIG. 7A may illustrate a display device 11 in a first mode, and FIG. 7B may illustrate the display device 11 in a second mode. The first mode may be a wide viewing angle mode, and the second mode may be a narrow viewing angle mode.

Referring to FIGS. 7A and 7B, the display device 11 according to another embodiment may include a first substrate 100, a first transistor 210, a first light-emitting element 310, a second light-emitting element 1320, an encapsulation layer ENC, a light guide layer 500, a light control layer 600, a light absorption layer 700, and a second substrate 800. The display device 11 according to another embodiment described with reference to FIGS. 7A and 7B may be substantially the same as or similar to the display device 10 described with reference to FIGS. 1 to 6 except for the second light-emitting element 1320 and omitting the second transistor. Therefore, repeated descriptions will be omitted or simplified.

The first light-emitting element 310 may be disposed in the display area DA on the first substrate 100. The first light-emitting element 310 may overlap the light-emitting area LA. The first light-emitting element 310 may emit the first light L1 having the first wavelength range. The first light L1 may be visible light. For example, the first light-emitting element 310 may emit red light, green light, or blue light.

The second light-emitting element 1320 may be disposed outside of a display panel. The second light-emitting element 1320 may be disposed adjacent to at least one side portion of the light guide layer 500. For example, as illustrated in FIGS. 7A and 7B, the second light-emitting element 1320 may be disposed adjacent to a side portion of the light guide layer 500 in the first direction DR1. A light-emitting surface 1321 of the second light-emitting element 1320 may face a side surface 501 of the light guide layer 500. For example, the second light-emitting element 1320 and the display panel may be accommodated by a housing (not illustrated).

The second light-emitting element 1320 may emit the second light L2 having the second wavelength range different from the first wave length range. For example, the second light may be UV light or IR light.

The second light-emitting element 1320 may emit the second light L2 only in the second mode. That is, the second light L2 may not be emitted from the second light-emitting element 1320 in the first mode, and the second light L2 may be emitted from the second light-emitting element 1320 in the second mode. In the second mode, the second light L2 may be emitted from the light-emitting surface 1321 of the second light-emitting element 1320 in the third direction DR3, and may be incident into the light guide layer 500 through the side surface 501 of the light guide layer 500. The second light L2 incident into the light guide layer 500 may be transmitted (e.g., may proceed) to the display area DA (i.e., in the third direction DR3 of FIG. 7B) by total internal reflection.

A first optical pattern 510 may be formed on the light guide layer 500. In an embodiment, the first optical pattern 510 may be formed on an upper surface or a lower surface of the light guide layer 500 overlapping the display area DA. The first optical pattern 510 may output (e.g., may emit) at least a portion of the second light L2 transmitted inside of the light guide layer 500 to outside of the light guide layer 500 (e.g., to an upper layer or a lower layer of the light guide layer 500). That is, the second light L2 transmitted (e.g., proceeding) in the third direction DR3 inside of the light guide layer 500 by total internal reflection may be partially emitted to the outside of the light guide layer 500 by the first optical pattern 510. Another portion of the second light L2 that is not emitted to the outside of the light guide layer 500 may be continuously transmitted in the third direction DR3 by total internal reflection.

In the display device 11 according to another embodiment, an optical pattern (e.g., the second optical pattern 520 of FIG. 2A) may not be formed on a portion of the lower surface of the light guide layer 500 overlapping the peripheral area PA.

Hereinafter, operations of the display device 11 in the first mode and the second mode will be described with reference to FIGS. 7A and 7B.

In FIG. 7A, when the display device 11 is in the first mode, the first light L1 (e.g., visible light) may be emitted from the first light-emitting element 310, and the second light L2 (e.g., UV light) may not be emitted from the second light-emitting element 1320. Accordingly, the light control layer 600 may not be discolored. Accordingly, the light control layer 600 may transmit the first light L1. That is, the first light L1 emitted from the light-emitting area LA may not blocked by the light control layer 600, and may be emitted to outside of the display device 11 through the second substrate 800. Accordingly, the display device 11 may have a wide viewing angle.

In FIG. 7B, when the display device 11 is switched to the second mode, the second light L2 may be emitted from the second light-emitting element 1320. As described above, the second light L2 emitted from the second light-emitting element 1320 may be transmitted to the display area DA through the light guide layer 500. In addition, a portion of the second light L2 transmitted inside of the light guide layer 500 may be output (e.g., may be emitted) to the outside of the light guide layer 500 (e.g., to the light control layer 600) by the first optical pattern 510. Accordingly, the light control layer 600 may be discolored. Accordingly, a portion of the first light L1a proceeding to the light control layer 600 among the first light L1 emitted from the light-emitting area LA may be blocked by the light control layer 600. Another portion of the first light L1b proceeding to openings OP1 and OP2 among the first light L1 emitted from the light-emitting area LA may not be blocked by the light control layer 600, and may be emitted to outside of the display device 11 through the second substrate 800. That is, when the display device 11 is in the second mode, the light control layer 600 may block the portion of the light L1a having a viewing angle greater than or equal to a predetermined angle among the first light L1 emitted from the light-emitting area LA. Accordingly, the display device 11 may have a narrow viewing angle.

When the display device 11 is switched to the first mode again, the second light L2 may not be emitted from the second light-emitting element 1320, and the light control layer 600 may be restored to have its original color. Accordingly, the light control layer 600 may transmit the first light L1 again, and the display device 11 may have the wide viewing angle again.

Figure 8B:
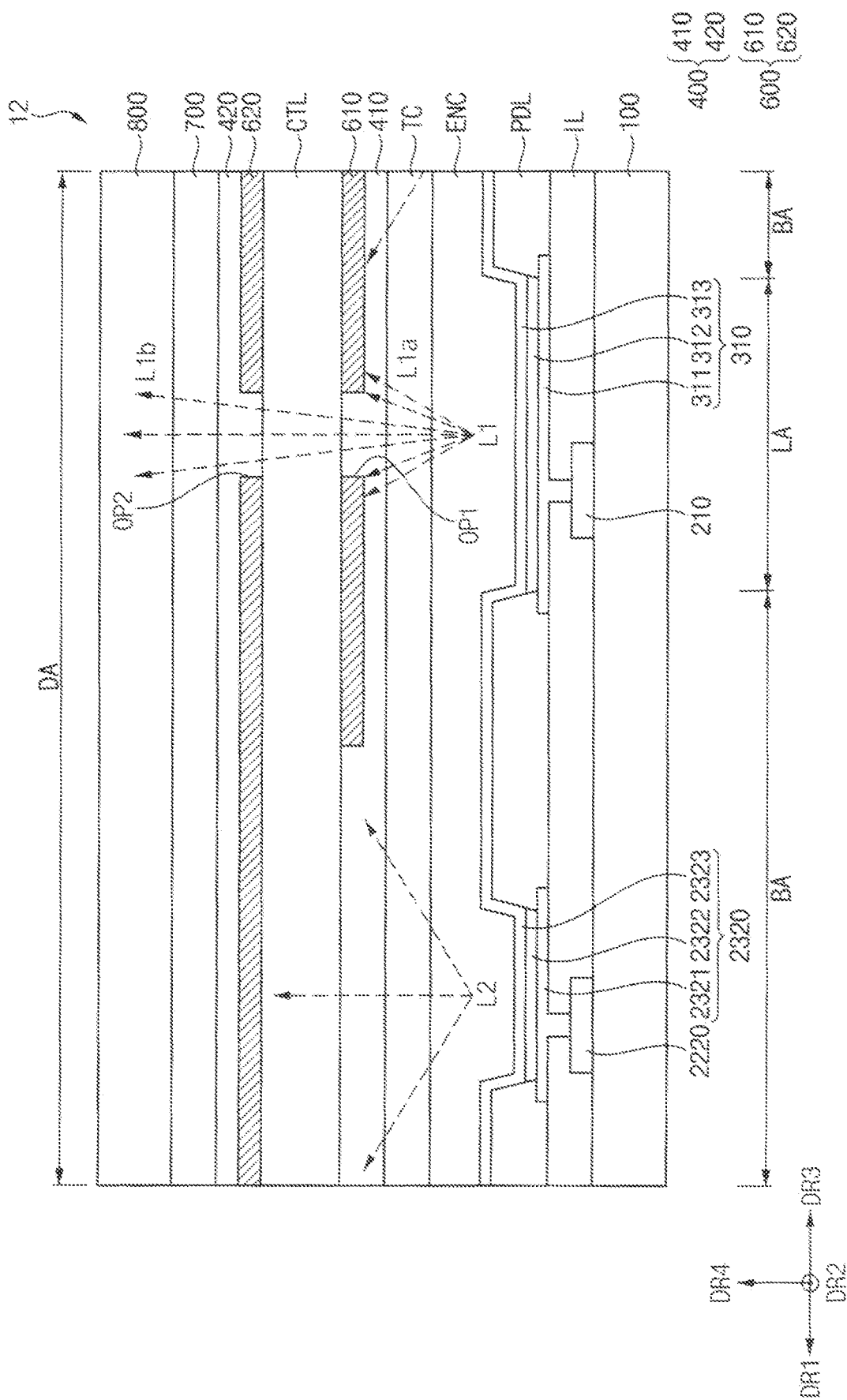

FIGS. 8A and 8B are cross-sectional views illustrating a display device according to still another embodiment. For example, FIG. 8A may illustrate a display device 12 in a first mode, and FIG. 8B may illustrate the display device 12 in a second mode. The first mode may be a wide viewing angle mode, and the second mode may be a narrow viewing angle mode.

Referring to FIGS. 8A and 8B, the display device 12 according to still another embodiment may include a first substrate 100, a first transistor 210, a first light-emitting element 310, a second transistor 2220, a second light-emitting element 2320, an encapsulation layer ENC, a light control layer 600, a light absorption layer 700, and a second substrate 800. The display device 12 according to still another embodiment described with reference to FIGS. 8A and 8B may be substantially the same as or similar to the display device 10 described with reference to FIGS. 1 to 6 except for the second transistor 2220, the second light-emitting element 2320, and omitting the light guide layer. Therefore, repeated descriptions will be omitted or simplified.

The display device 12 may include (e.g., have) the display area DA and the peripheral area PA. The plurality of pixels may be disposed in the display area DA. The display area DA may include the plurality of light-emitting areas LA and the light-blocking area BA. The light-emitting areas LA may correspond to the pixels, respectively. For example, the light-emitting areas LA may be arranged in a matrix form in the first direction DR1 and the second direction DR2. The light-blocking area BA may be around (e.g., surround) the light-emitting areas LA in a plan view.

For example, FIGS. 8A and 8B may correspond to each of the pixels. That is, each of the pixels may include the first transistor 210, the first light-emitting element 310, the second transistor 2220, and the second light-emitting element 2320. In addition, in FIGS. 8A and 8B, a width of the light-emitting area LA is illustrated to be less than a width of the light-blocking area BA, but the width of the light-emitting area LA may be greater than the width of the light-blocking area BA.

The first light-emitting element 310 may be disposed in the display area DA on the first substrate 100. The first light-emitting element 310 may overlap the light-emitting area LA. The first light-emitting element 310 may emit the first light L1 having the first wavelength range. The first light L1 may be visible light. For example, the first light-emitting element 310 may emit red light, green light, or blue light.

The second light-emitting element 2320 may be disposed in the display area DA on the first substrate 100. The second light-emitting element 2320 may be spaced apart from the first light-emitting element 310. For example, the second light-emitting element 2320 may overlap the light-blocking area BA. The second light-emitting element 2320 may emit the second light L2 having the second wavelength range different from the first wave length range. For example, the second light may be UV light or IR light.

The first light-emitting element 310 may be driven by the first transistor 210. The second light-emitting element 2320 may be driven by the second transistor 2220 different from the first transistor 210. That is, the second light-emitting element 2320 that emits the second light L2 (e.g., UV light) may be driven independently from the first light-emitting element 310 that emits the first light L1 (e.g., visible light).

For example, the first transistor 210 and the second transistor 2220 may be disposed in the display area DA on the first substrate 100.

The light control layer 600 may be disposed in the display area DA on the encapsulation layer ENC. That is, the light control layer 600 may be disposed on the first and the second light-emitting elements 310 and 2320. The light control layer 600 may have (e.g., may define) an opening exposing a portion of the light-emitting area LA.

The light control layer 600 may include a photochromic material that is discolored by a light having a specific wavelength range. In an embodiment, the photochromic material may be discolored by the second light L2 (e.g., UV light) having the second wavelength range. The photochromic material may not be discolored by the first light L1 (e.g., visible light) having the first wavelength range. In addition, when the photochromic material is not discolored by the second light L2, the photochromic material may transmit the first light L1. When the photochromic material is discolored by the second light L2, the photochromic material may absorb the first light L1.

In an embodiment, as illustrated in FIGS. 8A and 8B, the light control layer 600 may include a first light control layer 610 and a second light control layer 620 spaced apart from each other in the fourth direction DR4. For example, a light collecting layer CTL may be disposed between the first light control layer 610 and the second light control layer 620. However, embodiments are not limited thereto, and various functional layers capable of transmitting the first light L1 such as a touch sensing layer TC may be disposed between the first light control layer 610 and the second light control layer 620. In some embodiments, the light control layer 600 may be a single layer.

In the display device 12 according to still another embodiment, each of the pixels may include the first light-emitting element 310 and the second light-emitting element 2320. Accordingly, the second light L2 for switching between the first mode and the second mode may be emitted from each of the pixels disposed in the display area DA. Accordingly, a light guide layer (e.g., the light guide layer 500 of FIG. 2A) for transmitting the second light L2 to the display area DA may be omitted.

Hereinafter, operations of the display device 12 in the first mode and the second mode will be described with reference to FIGS. 8A and 8B.

In FIG. 8A, when the display device 12 is in the first mode, the first transistor 210 may drive the first light-emitting element 310, and the second transistor 2220 may not drive the second light-emitting element 2320. Accordingly, the first light L1 (e.g., visible light) may be emitted from the first light-emitting element 310, and the second light L2 (e.g., UV light) may not be emitted from the second light-emitting element 2320. Accordingly, the light control layer 600 may not be discolored. Accordingly, the light control layer 600 may transmit the first light L1. That is, the first light L1 emitted from the light-emitting area LA may not blocked by the light control layer 600, and may be emitted to outside of the display device 12 through the second substrate 800. Accordingly, the display device 12 may have a wide viewing angle.

In FIG. 8B, when the display device 12 is switched to the second mode, the second transistor 2220 may drive the second light-emitting element 2320. Accordingly, the second light L2 may be emitted from the second light-emitting element 2320. Accordingly, the light control layer 600 may be discolored. Accordingly, a portion of the first light L1a proceeding to the light control layer 600 among the first light L1 emitted from the light-emitting area LA may be blocked by the light control layer 600. Another portion of the first light L1b proceeding to openings OP1 and OP2 among the first light L1 emitted from the light-emitting area LA may not be blocked by the light control layer 600, and may be emitted to outside of the display device 12 through the second substrate 800. That is, when the display device 12 is in the second mode, the light control layer 600 may block the portion of the first light L1a having a viewing angle greater than or equal to a predetermined angle among the first light L1 emitted from the light-emitting area LA. Accordingly, the display device 12 may have a narrow viewing angle.

When the display device 12 is switched to the first mode again, the second transistor 2220 may not drive the second light-emitting element 2320. Accordingly, the second light L2 may not be emitted from the second light-emitting element 2320, and the light control layer 600 may be restored to have its original color. Accordingly, the light control layer 600 may transmit the first light L1 again, and the display device 12 may have the wide viewing angle again.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising: a substrate including a display area and a peripheral area adjacent to the display area, the display area including a light-emitting area and a light-blocking area; a first light-emitting element disposed in the light-emitting area on the substrate, the first light-emitting element emits a first light having a first wavelength range in a visible spectrum; a second light-emitting element disposed in the peripheral area on the substrate, the second light-emitting element emits a second light having a second wavelength range in a non-visible spectrum; a light control layer disposed on the first light-emitting element, the light control layer defining an opening exposing a portion of the light-emitting area; and a light guide layer disposed in the display area and the peripheral area, the light guide layer optically connecting the second light emitting element to the light control layer, wherein the light control layer includes a photochromic material such that in operation the second light transmits from the second light emitting element by way of the light guide layer to the light control layer and discolors the light control layer to at least partially block the first light.

2. The display device of claim 1, wherein the light guide layer contacts the light control layer, and
   a refractive index of the light guide layer is greater than a refractive index of the light control layer.

3. The display device of claim 1, wherein a first optical pattern is formed on the light guide layer, the first optical pattern overlapping the display area, at least a portion of the second light being output from the light guide layer to the light control layer by the first optical pattern.

4. The display device of claim 1, wherein the light control layer includes a first light control layer disposed under the light guide layer and a second light control layer disposed on the light guide layer.

5. The display device of claim 1, wherein the first light-emitting element is driven by a first transistor, and the second light-emitting element is driven by a second transistor different from the first transistor.

6. The display device of claim 1, further comprising a second light-emitting element disposed adjacent to a side portion of the light guide layer, the second light-emitting element emitting the second light having the second wavelength range.

7. The display device of claim 1, wherein the light control layer includes a first light control layer and a second light control layer disposed on the first light control layer and spaced apart from the first light control layer.

8. The display device of claim 1, further comprising a light absorption layer disposed on the light control layer, the light absorption layer selectively absorbing the second light having the second wavelength range.

9. The display device of claim 1, wherein the light control layer has a slit shape in a plan view.

10. The display device of claim 1, wherein the light control layer has a lattice shape in a plan view.

11. The display device of claim 1, wherein the light-emitting area is provided in plural, and the light control layer defines a plurality of openings overlapping the plurality of light-emitting area, respectively.

12. The display device of claim 1, wherein the first light is a red light, a green light, or a blue light, and the second light is ultraviolet (UV) light or infrared (IR) light.

13. The display device of claim 3, wherein the first optical pattern includes a diffraction grating selectively diffracting a light having the second wavelength range.

14. The display device of claim 3, wherein the first optical pattern includes a plurality of scattering patterns.

15. The display device of claim 3, wherein a second optical pattern is formed on the light guide layer, the second optical pattern overlapping the peripheral area, at least a portion of the second light emitted from the second light-emitting element being refracted toward the display area by the second optical pattern.

* * * * *